United States Patent

Jeong

(10) Patent No.: US 7,623,408 B2
(45) Date of Patent: Nov. 24, 2009

(54) SEMICONDUCTOR MEMORY DEVICE COMPRISING DATA PATH CONTROLLER AND RELATED METHOD

(75) Inventor: Woo-Pyo Jeong, Seocho-gu (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 149 days.

(21) Appl. No.: 11/730,653

(22) Filed: Apr. 3, 2007

(65) Prior Publication Data

US 2008/0049540 A1 Feb. 28, 2008

(30) Foreign Application Priority Data

Aug. 22, 2006 (KR) ............. 10-2006-0079424

(51) Int. Cl.
*G11C 8/16* (2006.01)
(52) U.S. Cl. ............. 365/233.13; 365/189.11; 365/194
(58) Field of Classification Search ......... 365/194, 365/233.13; 710/25
See application file for complete search history.

(56) References Cited

U.S. PATENT DOCUMENTS

| | | | | | |
|---|---|---|---|---|---|
| 5,245,231 | A | * | 9/1993 | Kocis et al. ............. | 327/277 |
| 6,151,271 | A | * | 11/2000 | Lee ............. | 365/230.03 |
| 6,154,393 | A | * | 11/2000 | Otsuka et al. ............. | 365/189.02 |
| 6,519,189 | B2 | * | 2/2003 | Jung ............. | 365/189.05 |
| 6,683,638 | B2 | * | 1/2004 | Sato ............. | 347/238 |
| 6,721,232 | B2 | * | 4/2004 | Kashiwazaki ............. | 365/189.15 |
| 7,020,792 | B2 | | 3/2006 | Hall | |
| 2001/0012233 | A1 | | 8/2001 | Hirabayashi | |

* cited by examiner

*Primary Examiner*—VanThu Nguyen
*Assistant Examiner*—R Lance Reidlinger
(74) *Attorney, Agent, or Firm*—Volentine & Whitt, PLLC

(57) ABSTRACT

A semiconductor memory device and a related method are disclosed. The semiconductor memory device includes a data sensing output unit simultaneously providing first and second data to first and second data path lines, respectively; and a data output circuit, wherein the first and second data are serially output to an output terminal through the data output circuit. The device further includes a data transmitter operationally connecting the first data path line to the data output circuit and operationally connecting the second data path line to the data output circuit; and a data path controller connected between the data sensing output unit and the data transmitter, delaying the second data, and including first and second delay elements, wherein each of the first and second delay elements is disposed along one of the first and second data path lines.

12 Claims, 8 Drawing Sheets

FIG.1 (CONVENTIONAL ART)
<Write>
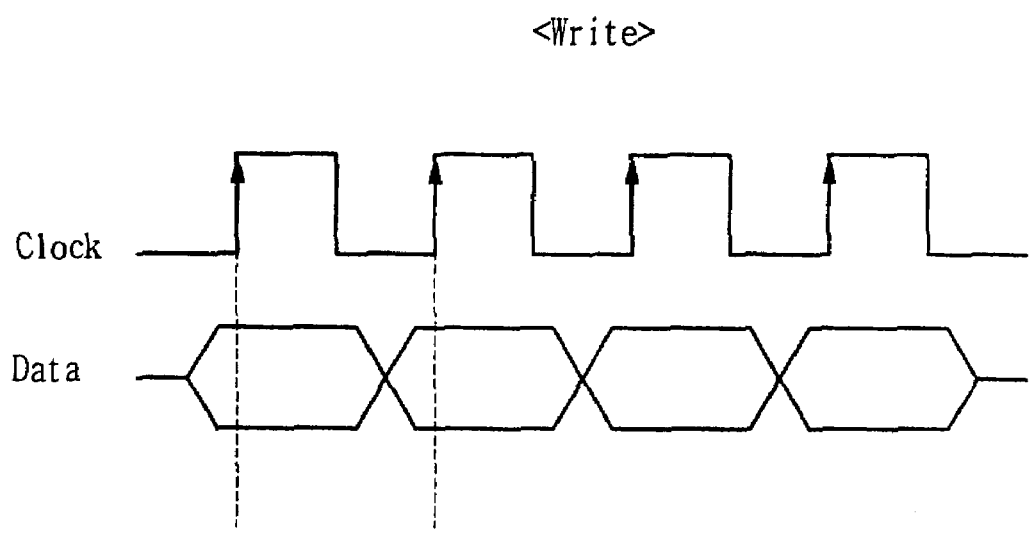
<Read>
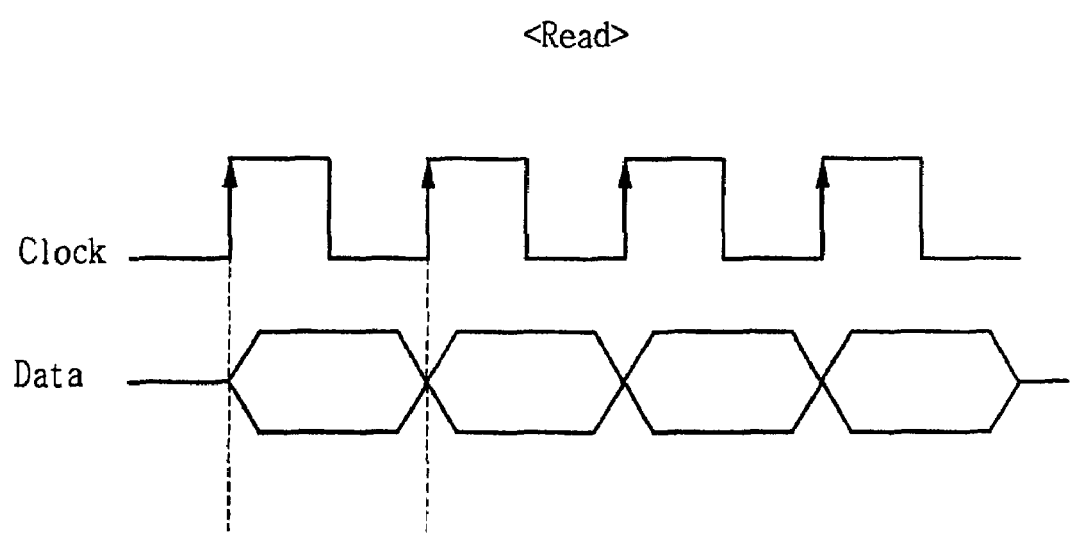

FIG.2 (CONVENTIONAL ART)
<Write>
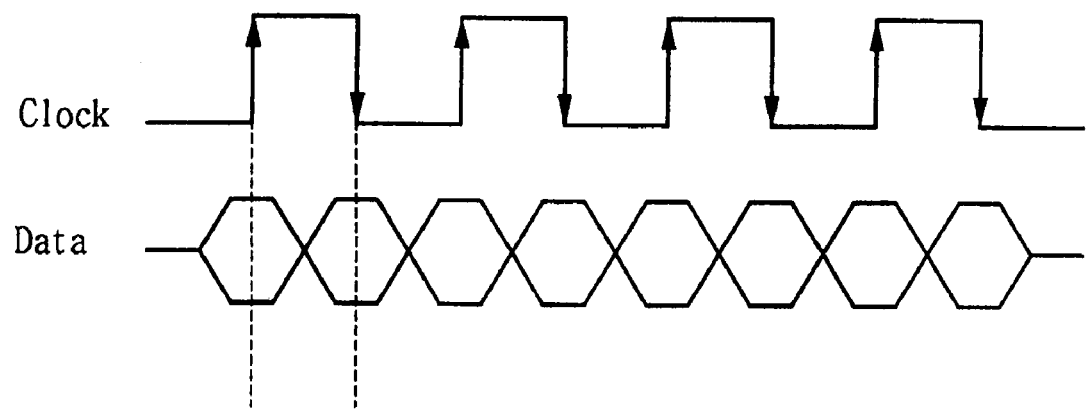
<Read>
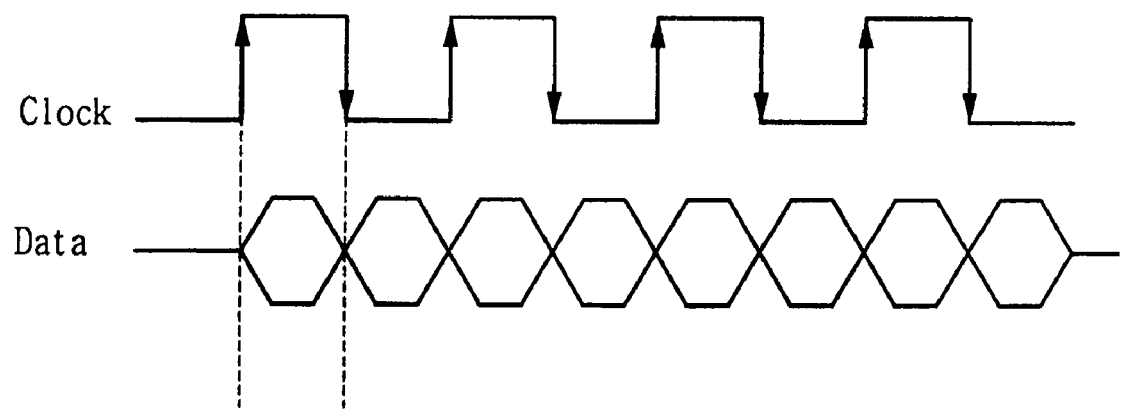

SEMICONDUCTOR MEMORY DEVICE COMPRISING DATA PATH CONTROLLER AND RELATED METHOD

BACKGROUND OF THE INVENTION

1. Field of the Invention

Embodiments of the invention relate to a semiconductor memory device and a related method. In particular, embodiments of the invention relate to a semiconductor memory device comprising a data path controller and a related method.

This application claims priority to Korean Patent Application 10-2006-0079424, filed on Aug. 22, 2006, the subject matter of which is hereby incorporated by reference in its entirety.

2. Description of the Related Art

The accuracy, speed, and corresponding bandwidth of data transmissions between contemporary central processing units (CPUs) and associated semiconductor memory devices are increasingly important to the proper operation of incorporating products.

In this regard, there are several types of Dynamic Random Access Memory (DRAM) devices commonly used with CPUs. One type is the single data rate (SDR) DRAM. A SDR DRAM accesses data in response to the rising edge of a controlling clock signal. Another type is the double data rate (DDR) DRAM. A DDR DRAM accesses data on both the rising and falling edges of a controlling clock signal, and generally provides greater data bandwidth over SDR DRAMs. Quadri-Data Rate (QDR) DRAMs have recently been introduced.

FIG. (FIG.) 1 is a timing diagram illustrating read and write operations for a SDR DRAM. As shown in FIG. 1, write operations are performed in accordance with a rising edge of the clock signal, and one bit of data is written each clock cycle. Likewise, read operations are performed in accordance with the rising edge of the clock signal, and one bit of data is read each clock cycle.

In contrast, FIG. 2 is a timing diagram illustrating read write operations for a DDR DRAM. Referring to FIG. 2, write operations are performed in accordance with rising and falling edges of the clock signal, and two bits of data are written each clock cycle. Likewise, read operations are performed in accordance with rising and falling edges of the clock signal, and two bits of data are read each clock cycle.

As may be seen from FIGS. 1 and 2, the DDR DRAM has a data access speed twice that of the SDR DRAM. However, it is often difficult to double the operating speed of a memory cell array and a corresponding cell core in order to actually obtain the faster access speeds offered by the DDR DRAM design.

As a result, it is conventional to retain the SDR operating speed of the memory cell array, but provide twice as many data lines that operate in a data prefetch scheme. With the data prefetch scheme and twice the number of data lines, twice as much data may be transferred to an output buffer, as compared with operation of a SDR DRAM. Once prefetched data is stored in the buffer, it may be output on the rising edge and falling edges of the clock signal to provide DDR DRAM access rates without necessarily impacting the core operating rate of the memory cell array.

FIG. 3 illustrates a data output circuit for a conventional DDR DRAM. For purposes of clarity, two data path lines P1 and P2 corresponding to one input/output pad PD1 are illustrated in FIG. 3. A data sensing output unit 100 outputs first and second data DIOF and DIOS in parallel on first and second data path lines P1 and P2, respectively. First and second data DIOF and DIOS are sensed through input/output sense amplifiers. A constituent data transmitter 200 includes a plurality of transmission gates FG1, FG2, and FG3. Transmission gate FG1 operationally connects first data path line P1 with data output circuit 300 in response to a first control clock signal CLK_F generated by a system clock. Together, transmission gates FG2 and FG3 operationally connect second data path line P2 with data output circuit 300. Transmission gate FG2 is responsive to first control clock signal CLK_F, and transmission gate FG3 is responsive to second control clock signal CLK_S generated by the system clock. An associated data output circuit 300 having first and second level shifters 310 and 320 alternately (i.e., serially) outputs the data applied in parallel to first and second data path lines P1 and P2. Through the operation of the data output circuit of FIG. 3, input/output pad PD1 receives data serially in accordance with the rising and falling edges of a system clock signal CLK.

FIG. 4 is a timing diagram further illustrating the data output operations of the data output circuit shown in FIG. 3. Like reference symbols indicate like signals in FIGS. 3 and 4. A data output operation of the data output circuit of FIG. 3 will now be described with reference to FIGS. 3 and 4.

System clock signal CLK controls operation of the DRAM including the data output circuit illustrated in FIG. 3. Data sensing output unit 100 of FIG. 3 outputs first and second data DIOF and DIOS to first and second data path lines P1 and P2, respectively. First and second data DIOF and DIOS are each sensed and amplified through input/output sense amplifiers of data sensing output unit 100. First and second control clock signals CLK_F and CLK_S derived from the system clock signal are applied to data transmitter 200 having transmission gates FG1, FG2, and FG3.

After first and second data DIOF and DIOS are output to first and second data path lines P1 and P2, respectively, first data DIOF is provided to an input terminal of transmission gate FG1, and second data DIOS is provided to an input terminal of transmission gate FG2. After transmission gate FG1 receives first control clock signal CLK_F, first data DIOF is delayed by a time tD, as shown in FIG. 4, and then output on an output terminal of first transmission gate FG1 as a first data DIOF1. Likewise, after transmission gate FG2 receives first control clock signal CLK_F, second data DIOS is delayed by a time tD, as shown in FIG. 4, and then output on an output terminal of second transmission gate FG2 as a second data DIOS1. Transmission gates FG1 and FG2 each respond to first control clock signal CLK_F, so first data DIOF1 and second data DIOS1 are provided to the output terminals of transmission gates FG1 and FG2, respectively, at the same time.

Second data DIOS1 is then latched at the output terminal of second transmission gate FG2. Subsequently, in response to second control clock signal CLK_S, second data DIOS1 is output by transmission gate FG3 as second data DIOS2. First data DIOF is output through input/output pad PD1 synchronously with the rising edge of system clock signal CLK, and second data DIOS is output through input/output pad PD1 synchronously with the falling edge of system clock signal CLK.

As shown in the timing diagram of FIG. 4, first and second data DIOF and DIOS are output from data sensing output unit 100 at the same time. However, first and second data DIOF and DIOS are output through input/output pad PD1 (i.e., output from the chip having the data output circuit of FIG. 3) half a clock cycle apart. This temporal disparity between data signals does not impede satisfactory operation of the data output circuit so long as the second data DIOS is applied to second data path line P2 before the second control clock CLK_S is activated (i.e., during a time period T1). However, the conventional data output circuit of FIG. 3 has transmission gate FG2 that responds to first control clock signal CLK_F, and second data DIOS is latched between transmission gates FG2 and FG3 as second data DIOS1. Maintaining second data DIOS between transmission gates FG2 and FG3 of second data path line P2 consumes current in the conventional data output circuit of FIG. 3. In addition, in a semiconductor memory device in accordance with the conventional data output circuit of FIG. 3 and comprising multiple input/output pads, an element such as transmission gate FG2 will be present for every input/output pad of the device, and each transmission gate FG2 will contribute to the size and cost of the semiconductor memory device.

Thus, a smaller data output circuit that reduces unnecessary current consumption but does not decrease data output speed is required.

SUMMARY OF THE INVENTION

Embodiments of the invention provide a semiconductor memory device comprising a data output circuit and a related method. The data output circuit may be smaller than a conventional data output circuit, so chip size may be reduced, and the data output circuit may be less expensive to fabricate. In addition, the data output circuit may consume less current than a conventional data output circuit without decreasing data output speed.

In one embodiment, the invention provides a semiconductor memory device outputting data in accordance with each of a first edge and a second edge of a system clock signal. The device comprises a system clock generating the system clock signal, a first control clock signal, and a second control clock signal; a data sensing output unit simultaneously providing first and second data to first and second data path lines, respectively, wherein the first and second data are sensed from selected memory cells; and a data output circuit, wherein the first and second data are serially output to an output terminal through the data output circuit. The device further comprises a data transmitter operationally connecting the first data path line to the data output circuit in response to the first control clock signal and operationally connecting the second data path line to the data output circuit in response to the second control clock signal; and a data path controller connected between the data sensing output unit and the data transmitter, delaying the second data relative to the first data, and comprising first and second delay elements, wherein each of the first and second delay elements is disposed along one of the first and second data path lines.

In another embodiment, the invention provides a double data rate (DDR) synchronous semiconductor memory device comprising an input/output sense amplifier sensing first and second data and outputting the first and second data at the same time; a data transmitter; and a data path controller electrically disposed between the input/output sense amplifier and the data transmitter, simultaneously receiving the first and second data from the input/output sense amplifier, providing the first data and the second data to the data transmitter at a different times, and comprising first and second delay elements. The device further comprises first and second data path lines connected to the input/output sense amplifier, wherein each of the first and second delay elements is disposed along one of the first data path line and the second data path line.

In yet another embodiment, the invention provides a semiconductor memory device comprising memory cells adapted to store data; first and second sense amplifiers connected in parallel relative to an output terminal, wherein the first and second sense amplifiers sense first and second data, respectively, from the memory cells and output the first and second data at the same time; and a data output circuit receiving the first and second data, wherein the first and second data are serially output to the output terminal through the data output circuit. The device further comprises a data path controller receiving the first and second data from the first and second sense amplifiers, providing the first and second data to the data output circuit, delaying the second data relative to the first data, and comprising first and second delay elements; and first and second data path lines connected to the first and second sense amplifiers, respectively, wherein each of the first and second delay elements is disposed along one of the first data path line and the second data path line.

In still another embodiment, the invention provides a method for outputting data from a semiconductor memory device. The semiconductor memory device comprises memory cells adapted to store data; first and second sense amplifiers connected in parallel relative to an output terminal, wherein the first and second sense amplifiers sense first and second data, respectively, and output the first and second data at the same time; and first and second data path lines connected to the first and second sense amplifiers. The device further comprises first and second delay elements, wherein each of the first and second delay elements is disposed on one of the first and second data path lines; a data output circuit receiving the first and second data, wherein the first and second data are serially output to an output terminal through the data output circuit; and a data transmitter electrically connected between the first and second sense amplifiers and the data output circuit. The method comprises outputting the first data through the data output circuit in response to a first control clock signal corresponding to a first edge of a system clock signal; delaying the second data relative to the first data using at least the first delay element, wherein delaying the second data causes the second data to reach the data transmitter later than the first data; and, after delaying the second data, outputting second data through the data output circuit in response to a second control clock signal corresponding to a second edge of the system clock signal.

BRIEF DESCRIPTION OF THE DRAWINGS

Embodiments of the invention will be described herein with reference to the accompanying drawings. In the drawings:

FIG. 1 shows a timing diagram for read operations and a timing diagram for write operations of a conventional single data rate (SDR) semiconductor memory device;

FIG. 2 shows a timing diagram for read operations and a timing diagram for write operations of a conventional double data rate (DDR) semiconductor memory device;

DESCRIPTION OF EMBODIMENTS

A detailed description of conventional circuits, dynamic random access memory (DRAM), announcing methods, and data output procedures will be omitted here. Throughout the drawings, like reference symbols indicate like or similar elements.

Figure 3:
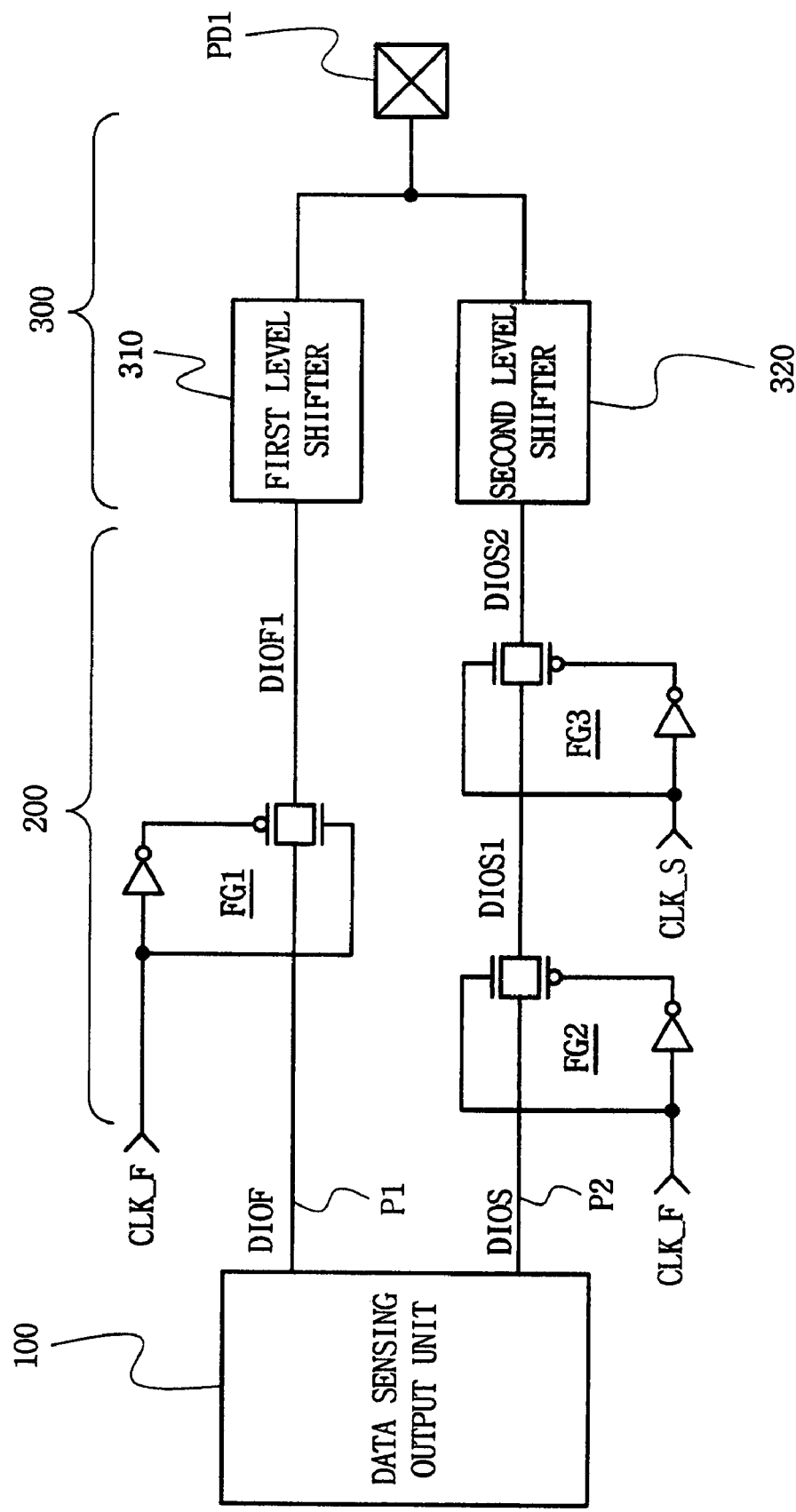
FIG. 3 illustrates a data path of a conventional data output circuit.
Figure 5:
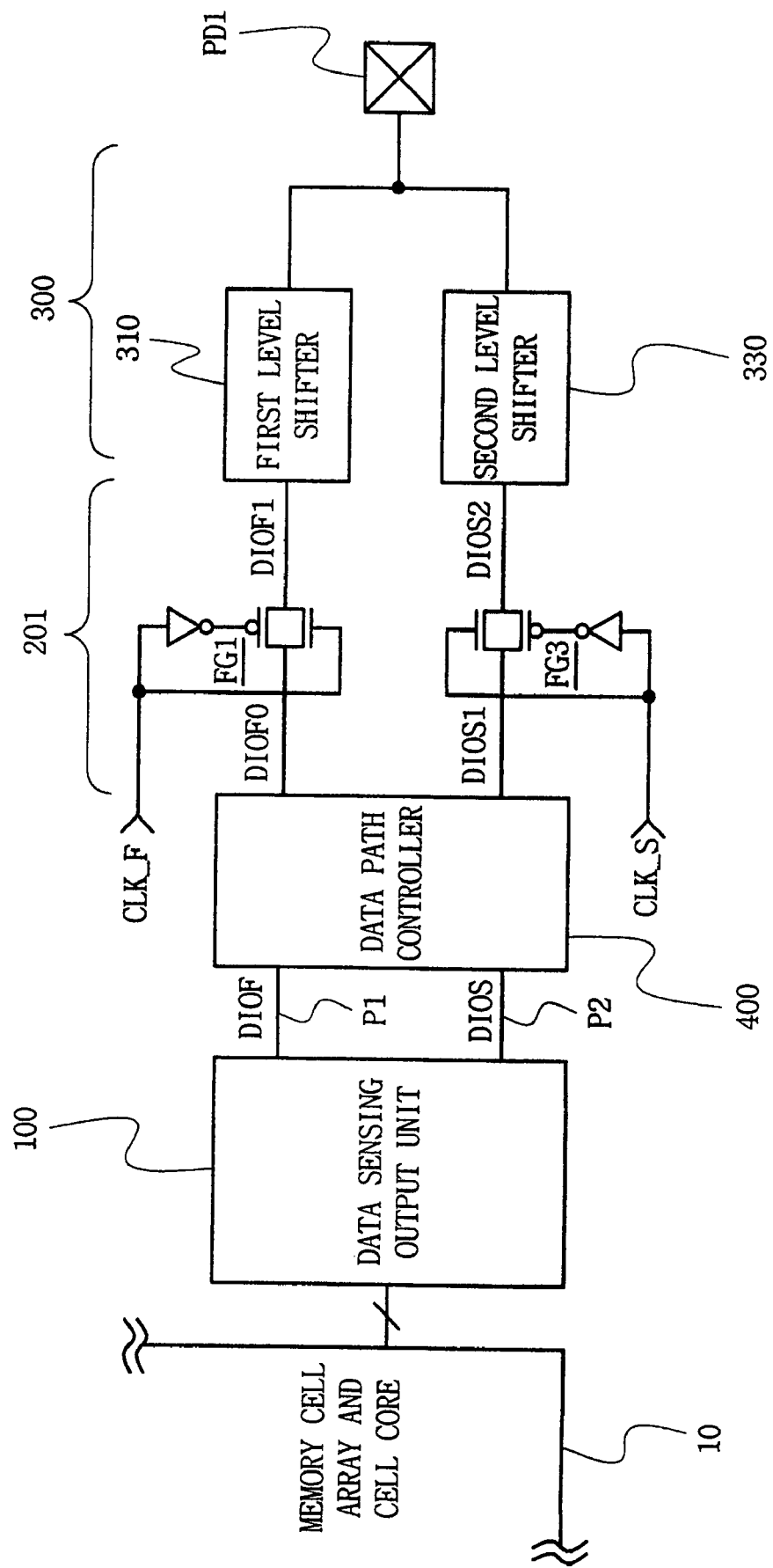
FIG. 5 illustrates a data path of a data output circuit in accordance with an embodiment of the invention.

FIG. 5 illustrates a data path of a data output circuit in accordance with an embodiment of the invention. The data path of the data output circuit of FIG. 5 is similar to that of FIG. 3, and FIG. 5 highlights a data path of a data output circuit. The data path of FIG. 5 corresponds to one input/output pad PD1 (i.e., output terminal PD1) and the data output circuit of FIG. 5 is part of a double data rate (DDR) semiconductor memory device.

Referring to FIG. 5, a memory cell array and cell core 10 may correspond to a cell array and cell core of a conventional DRAM device. A unit memory cell of the memory cell array may be a DRAM memory cell comprising an access transistor and a storage capacitor. The cell core comprises a conventional row and column decoders and associated bit line sense amplifiers. A selected word line is activated through the operation of the cell core, and then data stored in a memory cell is sensed and amplified by a bit line sense amplifier and then transferred to a local input/output line in accordance with the activation of a corresponding column selection line CSL. After the data is transferred to a local input/output line, the data is then transferred to a global input/output line through a switching operation of a multiplexer. Then, the data is applied to a data sensing output unit 100 comprising an input/output sense amplifier.

The data is then sensed and amplified by the input/output sense amplifier of data sensing output unit 100. The data sensed and amplified by the input/output sense amplifier of data sensing output unit 100 is then provided to first and second data path lines P1 and P2 as first and second data DIOF and DIOS, respectively. That is, first data DIOF and second data DIOS are prefetched at the same time through the input/output sense amplifier of data sensing output unit 100 and are output from data sensing output unit 100 in parallel so that the semiconductor memory device comprising the data output circuit of FIG. 5 will operate with a double data rate (DDR). Alternatively, data sensing output unit 100 may comprise first and second input/output sense amplifiers (which may be referred to as first and second "sense amplifiers") connected in parallel relative to input/output pad PD1. The first and second sense amplifiers are also connected to first and second data path lines P1 and P2. The first and second sense amplifiers may sense first and second data, respectively, from the memory cells and output the first and second data to first and second data path lines P1 and P2 at the same time.

The data output circuit illustrated in FIG. 5 comprises a data output circuit 300. The data output from data sensing output unit 100 in parallel is provided serially to data output circuit 300, which outputs the data serially through a corresponding output pad PD1. Data output circuit 300 of FIG. 5 functions in substantially the same way as data output circuit 300 of FIG. 3.

The data output circuit of FIG. 5 also comprises a data transmitter 201 comprising transmission gates FG1 and FG3. Transmission gate FG1 operationally connects first data path line P1 with data output circuit 300 in response to a first control clock signal CLK_F generated by a system clock. Transmission gate FG3 operationally connects second data path line P2 with data output circuit 300 in response to a second control clock signal CLK_S generated by the system clock. Data transmitter 200 of FIG. 3 comprises an additional transmission gate FG2 compared to data transmitter 201 of FIG. 5. In addition, the system clock also generates system clock signal CLK (see FIG. 6).

In addition, in accordance with an embodiment of the invention, the semiconductor memory device of FIG. 5 comprises a data path controller 400 electrically connected between data sensing output unit 100 and data transmitter 201. Data path controller 400 is adapted to selectively delay the data provided through data path lines P1 and P2 and control the amount, if any, that the data on each of those data path lines is delayed.

Data transmitter 201 and data output circuit 300 convert parallel data into serial data and thus may be referred to as a data converter. That is, data transmitter 201 and data output circuit 300 take data output from data sensing output unit 100 in parallel and provide it to output pad PD1 serially.

Figure 6:
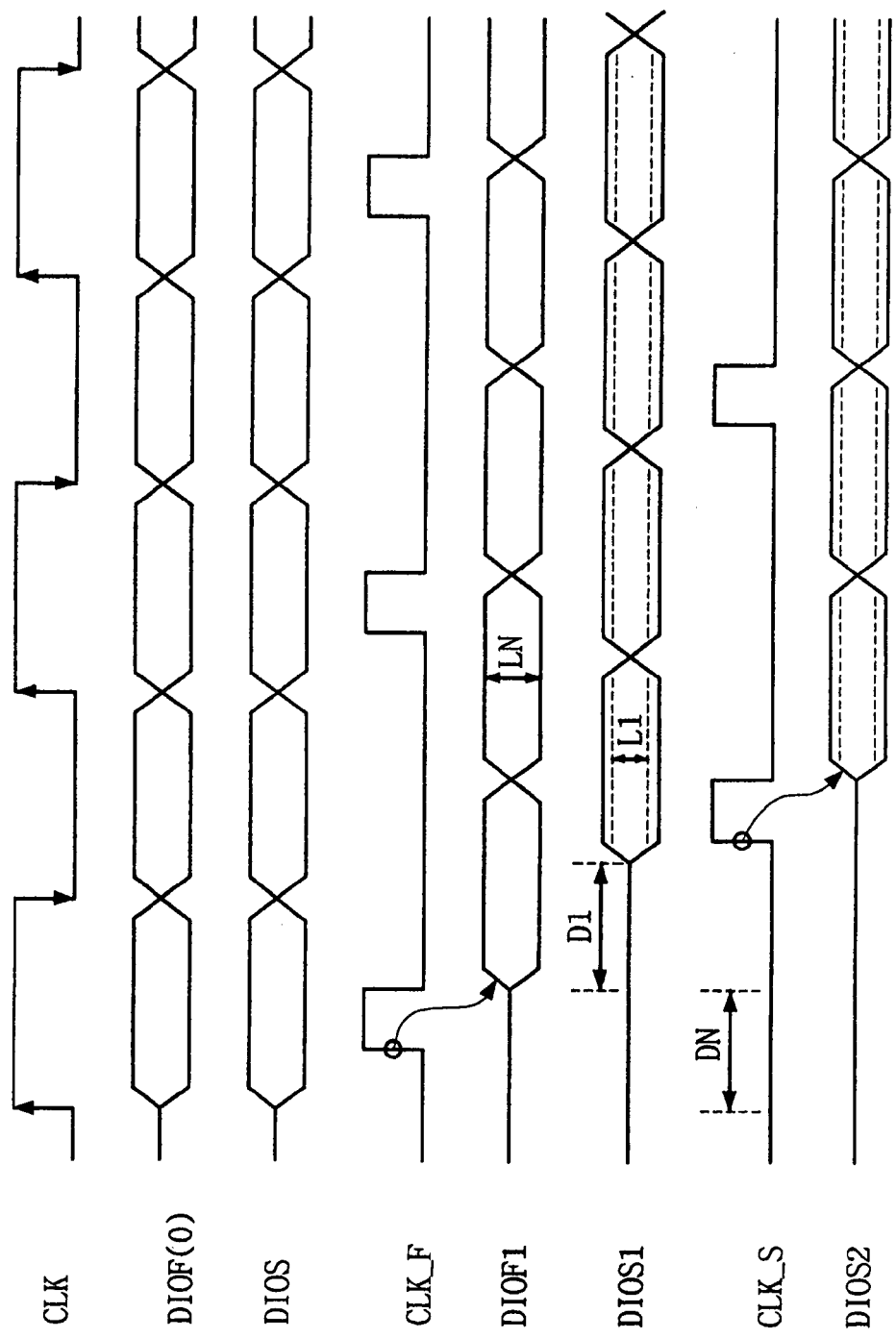
FIG. 6 is a timing diagram illustrating operations of the data output circuit illustrated in FIG. 5; and, FIGS. 7 to 9 illustrate embodiments of a data path controller of FIG. 5.
Figure 7:
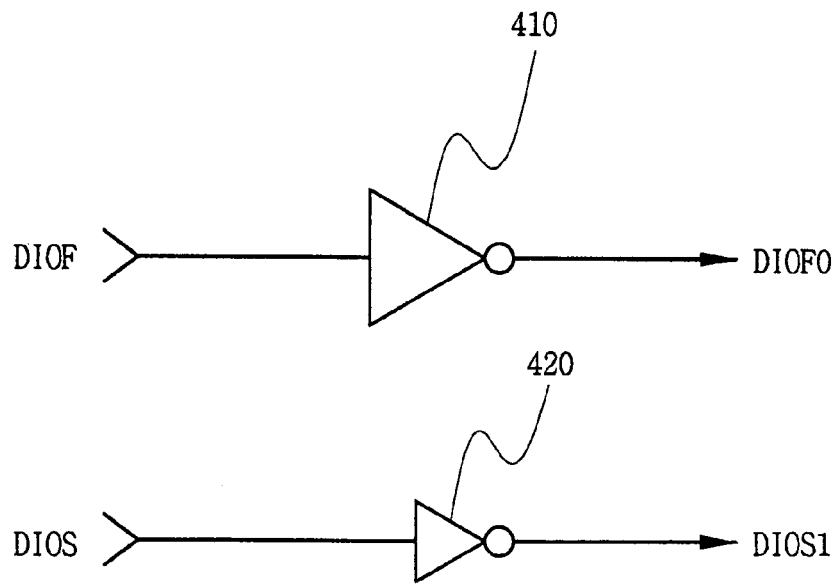
Figure 8:
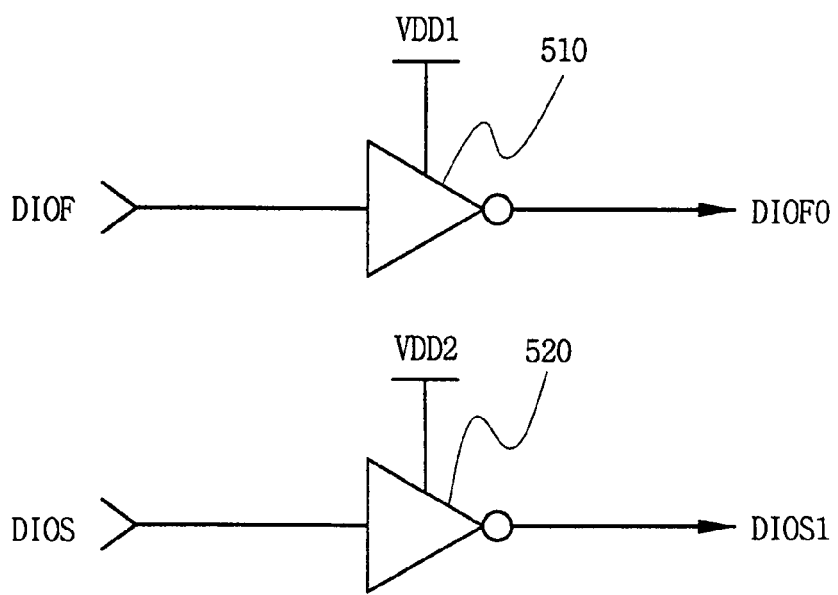
Figure 9:
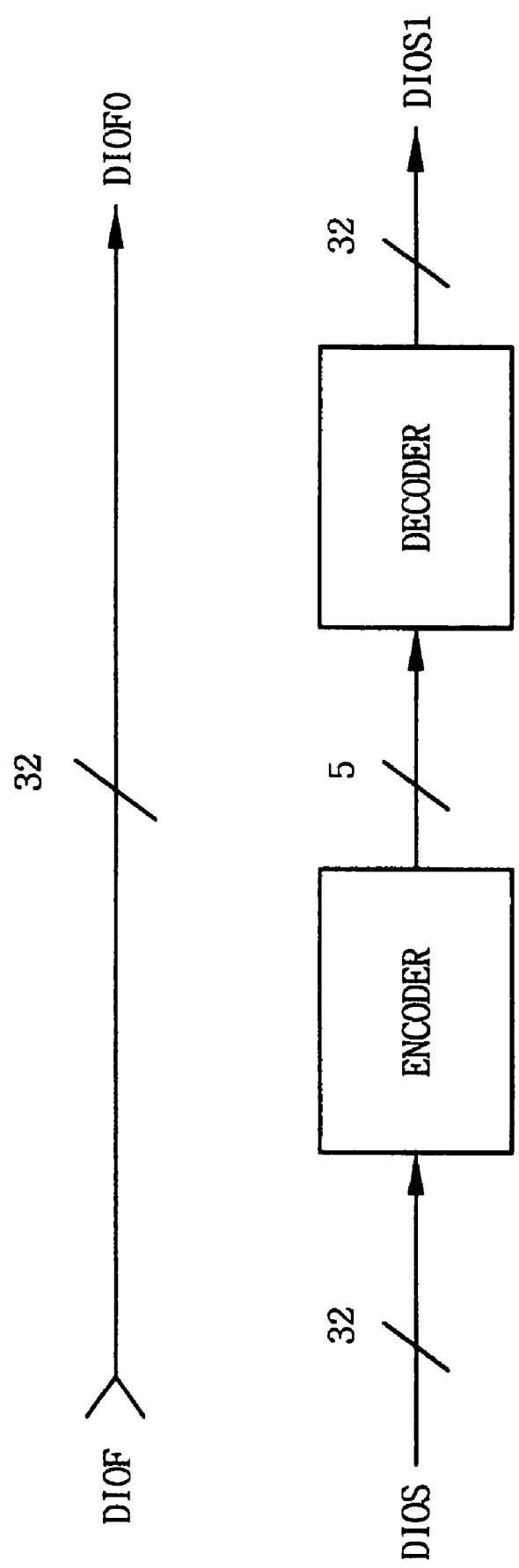

FIGS. 7 to 9 illustrate embodiments of data path controller 400 of FIG. 5. Referring to FIG. 7, a first inverter 410 is disposed along a first data path line P1 and a second inverter 420 smaller than first inverter 410 is disposed along a second data path line P2. Second inverter 420 is small enough to delay second data DIOS for an amount of time corresponding to half a cycle of the system clock. In other words, second inverter 420 delays second data DIOS for an amount of time equal to a time D1 of FIG. 6, and second data DIOS is then provided to transmission gate FG3 as a delayed second data DIOS1. By eliminating transmission gate FG2 (relative to the data output circuit of FIG. 3) and using data path controller 400 comprising first and second inverters 410 and 420 to delay second data DIOS relative to first data DIOF (i.e., to provide second data DIOS to an input terminal of transmission gate FG3 more slowly than it provides first data DIOF to an input terminal of transmission gate FG1), current consumption of the data path illustrated in FIG. 5 can be reduced relative to the data path illustrated in FIG. 3 without lowering a data output speed. In addition, because first and second inverters 410 and 420 replace transmission gate FG2, the data output circuit of FIG. 5 is smaller than the data output circuit of FIG. 3.

FIG. 8 illustrates data path controller 400 in accordance with another embodiment of the invention. In the embodiment illustrated in FIG. 8, data path controller 400 comprises first and second inverters 510 and 520 that function as drivers. In accordance with the embodiment illustrated in FIG. 8, when the respective sizes of first and second inverters 510 and 520 cannot be controlled (i.e., when the inverters are provided intact), different operating voltages are applied to first and second inverters 510 and 520. A first power voltage VDD1 is provided to first inverter 510 and a second power voltage VDD2 is provided to second inverter 520. The voltage level of second power voltage VDD2 is lower than the voltage level of first power voltage VDD1. The voltage level of second power voltage VDD2 is low enough to delay second data DIOS for an amount of time corresponding to half a cycle of the system clock. A second data path line P2 may provide a lower transmission speed than first data path line P1 due to a second power voltage VDD2 provided to second inverter 520 having a voltage level that is lower than the voltage level of a first power voltage VDD1 provided to first inverter 510. In addition, in the data output circuit of FIG. 5, transmission gate FG2 is eliminated (relative to the data output circuit of FIG. 3), and second data DIOS is provided to transmission gate FG3 slower than first data DIOF is provided to transmission gate FG1 because a lower operating voltage is provided to second inverter 520 relative to the operating voltage provided to first inverter 510. Thus, the data path illustrated in FIG. 5 consumes relatively less current than the conventional data path of FIG. 3, but does not have a slower data output speed than the conventional data path of FIG. 3. In addition, the data path illustrated in FIG. 5 may comprise fewer circuit elements than the conventional data path illustrated in FIG. 3.

FIG. 9 illustrates another embodiment of data path controller 400. Referring to FIG. 9, a bit conversion encoder and a bit conversion decoder are disposed along second data path line P2 and delay second data DIOS provided along second data path line P2. For example, as illustrated in FIG. 9, when 32 bits of data are provided along each of first and second data path lines P1 and P2, 5 bits of data are provided from the encoder to the decoder along second data path line P2. The encoder and decoder of FIG. 9 delay second data DIOS on second data path line P2 relative to first data DIOF on first data path line P1 by an amount of time less than or equal to half a clock cycle of the system clock. By delaying second data DIOS rather than using a transmission gate FG2 of FIG. 3 to latch data between transmission gates FG2 and FG3, the data output circuit of FIG. 5 uses less current than the data output circuit of FIG. 3. The data bit conversion encoder and decoder are well known in the art, so a detailed description thereof will be omitted here.

Figure 4:
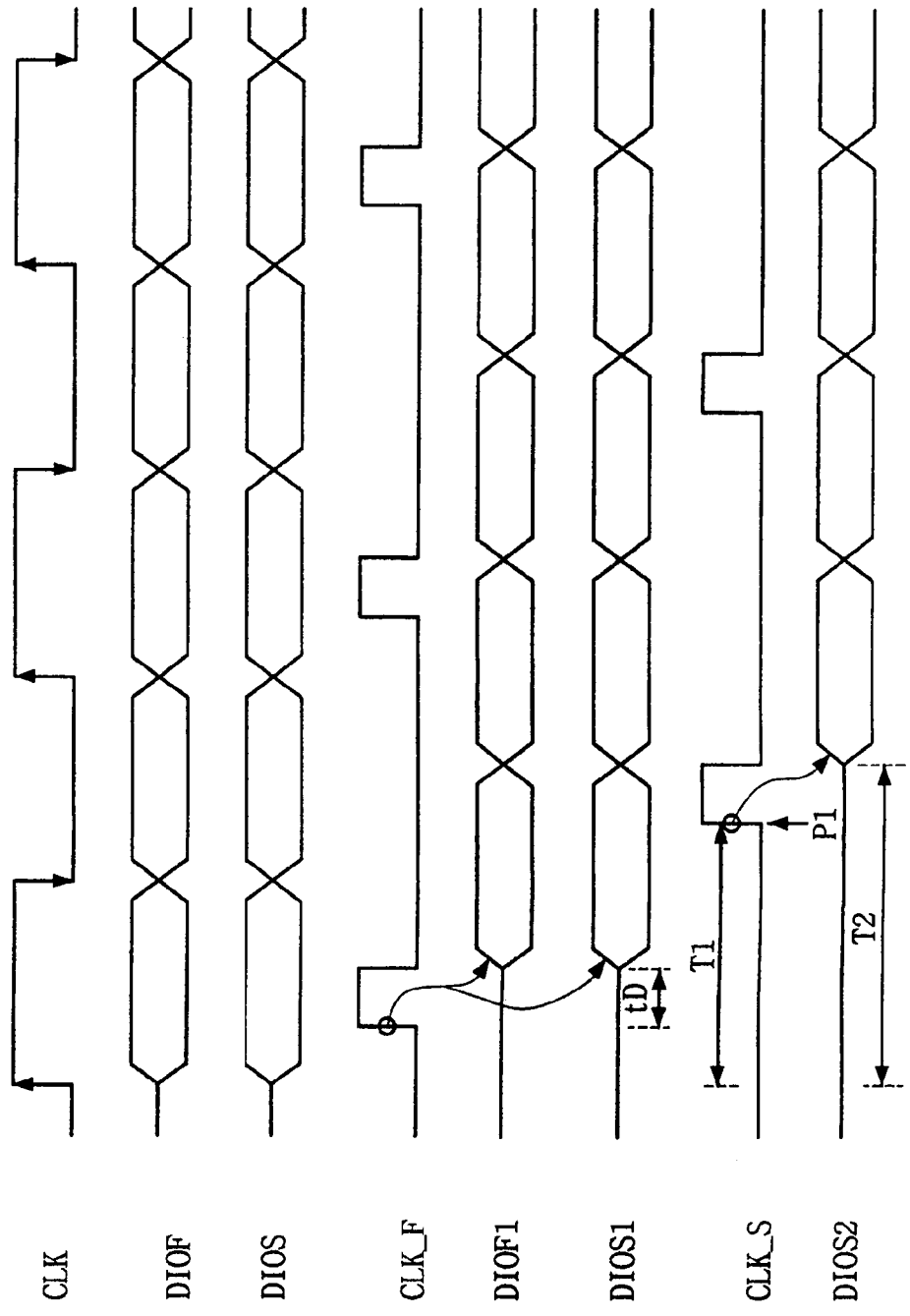
FIG. 4 is a timing diagram illustrating operations of the data output circuit illustrated in FIG. 3.

FIG. 6 is a timing diagram illustrating operations of the data output circuit of FIG. 5. Referring to FIGS. 4 and 6, the timings of FIGS. 4 and 6 are similar, except that, in FIG. 6, second data DIOS1 is provided to transmission gate FG3 after a delay of DN after first data DIOF1 is output by transmission gate FG1, rather than those events occurring at the same time, as in FIG. 4. Though the data output circuit of FIG. 5 has the delay DN of FIG. 6, current consumption in the data output circuit of FIG. 5 is reduced relative to the data output circuit of FIG. 3, the data output circuit of FIG. 5 may be smaller than the data output circuit of FIG. 3, and the data output speed of the data output circuit of FIG. 5 does not decrease relative to that of the data output circuit of FIG. 3. In addition, as shown in FIG. 6 by the dotted lines and reference symbols L1 and LN, the voltage level of second data DIOS1 may not be high enough for a logic high level or low enough for a logic low level, while the voltage level of first data DIOF1 is high enough for a logic high level or low enough for a logic low level. When the voltage level of second data DIOS1 is not high or low enough, second level shifter 330 of FIG. 5, which receives second data DIOS2 having the same voltage level as second data DIOS1 and appropriately raises or lowers the voltage level of second data DIOS2 to the appropriate level. Appropriately high and low voltage levels have a difference represented by LN in FIG. 6. Thus, although a voltage level that is not high enough or not low enough may be input to second level shifter 330, second level shifter will output a low voltage that is as low as a low voltage output by first level shifter 310 or output a high voltage that is as high as a high voltage that is output by first level shifter 310.

Although embodiments of the invention have been described herein with reference to a DDR semiconductor memory device that outputs data in response to rising and falling edges of a system clock signal, the invention is not limited to those embodiments.

In addition, examples of an electronic system that may use a semiconductor memory device in accordance with an embodiment of the invention are portable computing devices, or portable communication devices such as mobile communication devices. Examples of mobile communication devices are cellular phones, bidirectional radio communication systems, single-directional pagers, bi-directonal pagers, personal communication systems, and portable computers, etc.

In a semiconductor memory device in accordance with an embodiment of the invention, the amount of current used by a data output circuit may be reduced without decreasing data output speed. In addition, the size of the data output circuit may be reduced by reducing the number of circuit elements in a semiconductor memory device in accordance with an embodiment of the invention, so the fabrication cost of a semiconductor memory device in accordance with an embodiment of the invention may also be reduced.

Although embodiments of the invention have been described herein, modifications may be made to the embodiments by those skilled in the art without departing from the scope of the invention as defined by the accompanying claims. For example, the internal configuration of a data path controller, a data transmission method, or a data access method may be changed without departing from the scope of the invention as defined by the accompanying claims.

What is claimed is:

1. A semiconductor memory device outputting data in accordance with each of a first edge and a second edge of a system clock signal, the device comprising:
   a system clock generating the system clock signal, a first control clock signal, and a second control clock signal;
   a data sensing output unit respectively providing first and second data to first and second data paths, wherein the first and second data are sensed from selected memory cells;
   a data output circuit serially outputting the first and second data at a single data Input/Output (I/O) pad;
   a data transmitter operationally connecting the first data path to the data output circuit through only a single first transmission gate responsive to the first control clock signal, and operationally connecting the second data path to the data output circuit through only a single second transmission gate responsive to the second control clock signal; and
   a data path controller connected between the data sensing output unit and the data transmitter, and delaying the first data on the first data path by a first delay period using a first delay element and delaying the second data on the second data path by a second delay period different from the first delay period using a second delay element,
   wherein the first delay element is a first driver disposed along the first data path line, the second delay element is a second driver disposed along the second data path line, and the second driver is smaller than the first driver.

2. The device of claim 1, wherein the second data is delayed relative to the first data by a period of time less than half a cycle of the system clock signal.

3. The device of claim 1, wherein a swing level of the second data is lower than a swing level of the first data.

4. The device of claim 3, wherein the first delay element receives a first power voltage and the second delay element receives a second power voltage lower than the first voltage level.

5. The device of claim 1, wherein the first transmission gate comprises a first Complementary Metal Oxide Semiconductor (CMOS) transmission gate responsive to the first control clock signal, and the second transmission gate comprises a second CMOS transmission gate responsive to the second control clock signal.

6. The device of claim 1, wherein the first edge of the system clock signal is a rising edge and the second edge of the system clock signal is a falling edge.

7. The device of claim 1, wherein the data output circuit comprises a first level shifter receiving the first data from the first data path and a second level shifter receiving the second data from the second data path.

8. The device of claim 1, wherein a rising edge of the first control clock signal and a rising edge of the second control clock signal occur half a clock cycle of the system clock apart.

9. A semiconductor memory device outputting data in accordance with each of a first edge and a second edge of a system clock signal, the device comprising a system clock generating the system clock signal, a first control clock signal, and a second control clock signal;

- a data sensing output unit respectively providing first and second data to first and second data paths, wherein the first and second data are sensed from selected memory cells;
- a data output circuit serially outputting the first and second data at a single data Input/Output (I/O) pad;
- a data transmitter operationally connecting the first data path to the data output circuit through only a single first transmission gate responsive to the first control clock signal, and operationally connecting the second data path to the data output circuit through only a single second transmission gate responsive to the second control clock signal; and
- a data path controller connected between the data sensing output unit and the data transmitter, and delaying the first data on the first data path by a first delay period using a first delay element and delaying the second data on the second data path by a second delay period different from the first delay period using a second delay element, wherein the second delay element comprises a series connected bit conversion encoder and decoder disposed along the second data path.

10. A method for outputting data from a double data rate (DDR) semiconductor memory device, the method comprising:

- sensing, amplifying and outputting first data via a first data path and second data via a second data path parallel to the first data path;
- before passing the first and second data to a data transmitter, delaying the first data on the first data path by a first delay period using a first delay element and delaying the second data on the second data path by a second delay period different from the first delay period using a second delay element, wherein the first delay element is a first driver disposed along the first data path line, the second delay element is a second driver disposed along the second data path line, and the second driver is smaller than the first driver;
- passing the first and second data through the data transmitter via parallel signal paths, wherein passing the first data through the data transmitter is controlled by a single first transmission gate responsive to a first control clock signal and passing the second data through the data transmitter is controlled by a single second transmission gate responsive to a second control clock signal different from the first control clock signal; and
- converting the first and second data passed from the data transmitter into serial first and second data, and outputting the serial first and second data at a single Input/Output (I/O) pad.

11. The method of claim 10, wherein the first control clock signal corresponds to a first edge of a system clock signal controlling operation of the DDR semiconductor memory device, and the second control clock signal corresponds to a second edge of the system clock signal.

12. The method of claim 11, wherein the first edge of the system clock signal is a rising edge and the second edge of the system clock signal is a falling edge.

* * * * *